US011760626B2

(12) United States Patent
Goergen

(10) Patent No.: US 11,760,626 B2
(45) Date of Patent: Sep. 19, 2023

(54) APPARATUS AND METHOD FOR DISSIPATING HEAT WITH MICROELECTROMECHANICAL SYSTEM

(71) Applicant: Cisco Technology, Inc., San Jose, CA (US)

(72) Inventor: Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/738,054

(22) Filed: May 6, 2022

(65) Prior Publication Data

US 2022/0259036 A1 Aug. 18, 2022

Related U.S. Application Data

(62) Division of application No. 17/064,570, filed on Oct. 6, 2020, now Pat. No. 11,358,860.

(60) Provisional application No. 63/013,488, filed on Apr. 21, 2020, provisional application No. 63/012,845, filed on Apr. 20, 2020.

(51) Int. Cl.
*B81B 7/00* (2006.01)
*B81B 7/02* (2006.01)

(52) U.S. Cl.
CPC .......... *B81B 7/0019* (2013.01); *B81B 7/0093* (2013.01); *B81B 7/02* (2013.01)

(58) Field of Classification Search
None
See application file for complete search history.

(56) References Cited

U.S. PATENT DOCUMENTS

| 7,972,178 B2 | 7/2011 | Chan |
| 10,153,261 B2 | 12/2018 | Dogruoz |
| 10,573,608 B2 | 2/2020 | Dogiamis |
| 10,588,241 B2 * | 3/2020 | Goergen .............. G05D 7/0676 |
| 10,674,241 B2 | 6/2020 | Rivaud |
| 2002/0043895 A1 | 4/2002 | Richards et al. |
| 2007/0048154 A1 | 3/2007 | Sapir |
| 2015/0013936 A1 | 1/2015 | Mack |
| 2018/0212385 A1 | 7/2018 | Little |
| 2019/0044299 A1 | 2/2019 | Kazav et al. |
| 2019/0243080 A1 | 8/2019 | Ahmadi et al. |
| 2020/0053905 A1 | 2/2020 | Ganti et al. |
| 2020/0077541 A1 | 3/2020 | Sharf |
| 2021/0180723 A1 | 6/2021 | Makundan et al. |
| 2021/0323811 A1 | 10/2021 | Goergen |
| 2021/0329810 A1 | 10/2021 | Goergen |

FOREIGN PATENT DOCUMENTS

WO 2004077629 A1 9/2004

* cited by examiner

*Primary Examiner* — Benjamin P Sandvik

(57) ABSTRACT

In one or more embodiments, an apparatus generally comprises a microelectromechanical system (MEMS) module comprising a plurality of air movement cells and a power unit operable to control the plurality of air movement cells, and a housing configured for slidably receiving the MEMS module and positioning the MEMS module adjacent to a heat generating component of a network device. The MEMS module is operable to dissipate heat from the heat generating component and is configured for online installation and removal during operation of the heat generating component.

20 Claims, 12 Drawing Sheets

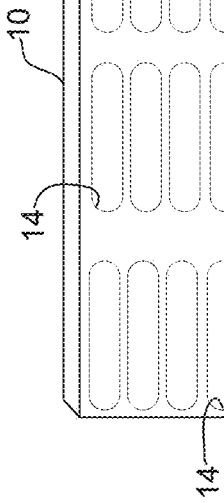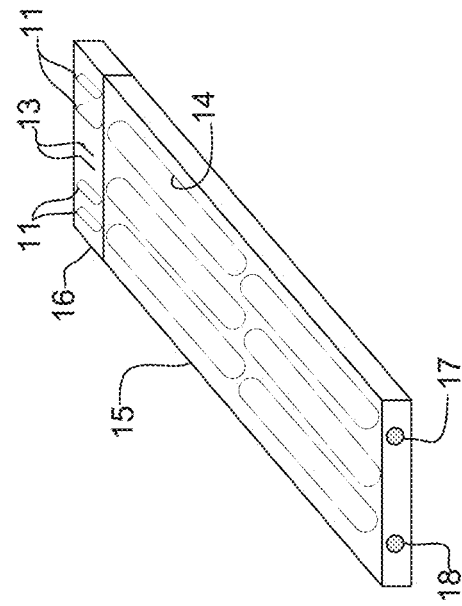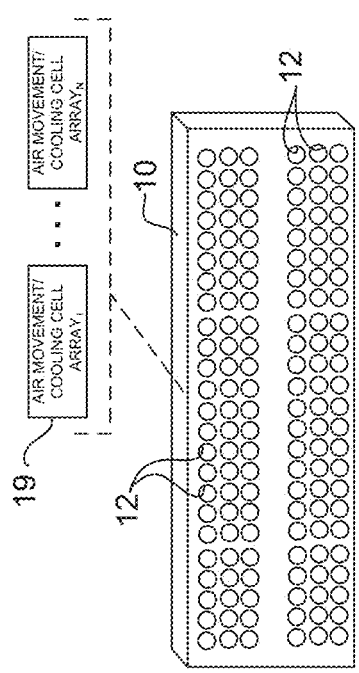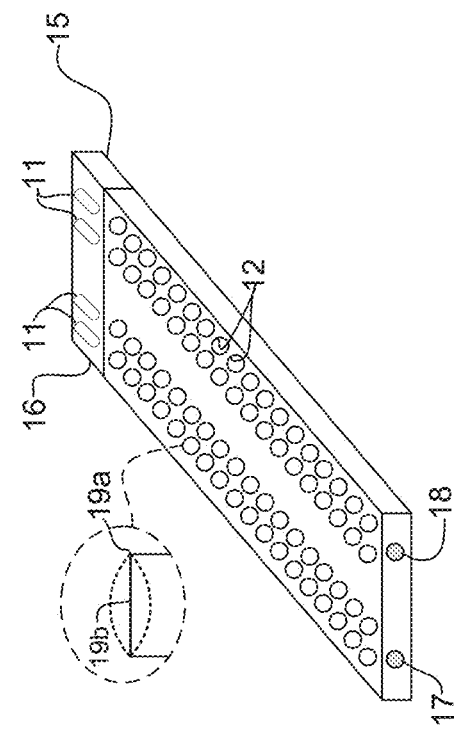
FIGURE 1A
FIGURE 1B
FIGURE 1C
FIGURE 1D

APPARATUS AND METHOD FOR DISSIPATING HEAT WITH MICROELECTROMECHANICAL SYSTEM

STATEMENT OF RELATED APPLICATIONS

The present application is a divisional of U.S. application Ser. No. 17/064,570, filed Oct. 6, 2020, which claims priority from U.S. Provisional Applications No. 63/012,845 entitled HEAT DISSIPATION FOR COOLING HIGH POWER OPTICAL MODULES, filed on Apr. 20, 2020 and U.S. Provisional Application No. 63/013,488 entitled HEAT DISSIPATION FOR COOLING ACCESS POINT COMPONENTS, filed on Apr. 21, 2020. The contents of these provisional applications are incorporated herein by reference in their entirety.

TECHNICAL FIELD

The present disclosure relates generally to cooling network device components, and more particularly, to the use of microelectromechanical systems (MEMS) for cooling components such as optical modules or access point components.

BACKGROUND

Over the past several years, there has been a tremendous increase in the need for higher performance communications networks. Increased performance requirements have led to an increase in energy use resulting in greater heat generation from network device components. Traditional cooling methods may be inadequate for these increased performance components, which typically have limited space for cooling.

BRIEF DESCRIPTION OF THE DRAWINGS

FIG. 1A is a top view of a microelectromechanical system (MEMS) block, in accordance with one embodiment.

FIG. 1B is a bottom view of the MEMS block shown in FIG. 1A.

FIG. 1C is a top perspective of the MEMS block of FIG. 1A coupled to a power module, in accordance with one embodiment.

FIG. 1D is a bottom perspective of a MEMS module of FIG. 1C.

Corresponding reference characters indicate corresponding parts throughout the several views of the drawings.

DESCRIPTION OF EXAMPLE EMBODIMENTS

Overview

Figure 2:
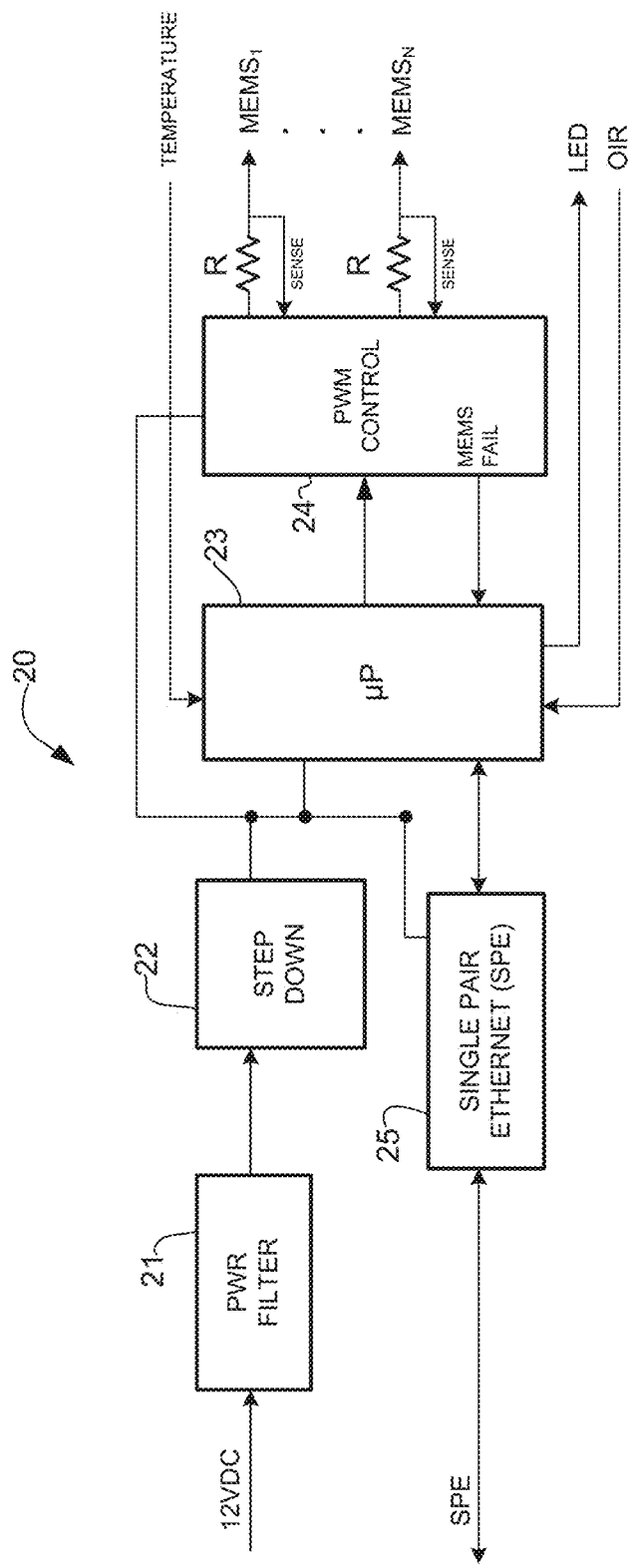
FIG. 2 is a block diagram of the power unit, in accordance with one embodiment.

In one embodiment, an apparatus generally comprises a microelectromechanical system (MEMS) module comprising a plurality of air movement cells and a power unit operable to control the plurality of air movement cells, and a housing configured for slidably receiving the MEMS module and positioning the MEMS module adjacent to a heat generating component of a network device. The MEMS module is operable to dissipate heat from the heat generating component and is configured for online installation and removal during operation of the heat generating component.

In another embodiment, an apparatus generally comprises a microelectromechanical system (MEMS) module comprising a plurality of air movement cells and a power unit operable to control the plurality of air movement cells, and an optical module. The MEMS module is mounted on the optical module for insertion with the optical module into an optical module cage and is operable to dissipate heat from the optical module.

In yet another embodiment, a method generally comprises controlling at a power unit, a plurality of air movement cells in a microelectromechanical system (MEMS) module to cool a heat generating component positioned adjacent to the MEMS module, receiving an indication of removal of the MEMS module, monitoring a temperature at the heat generating component, and modifying an operating mode of the heat generating component upon the temperature exceeding a predetermined limit.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Over the past several years, there has been a tremendous increase in the need for higher performance communications networks, which has led to an increase in energy use resulting in greater heat generation at network device components, including for example, optical modules and access point (AP) components.

In order to satisfy the increasing demand of bandwidth and speed, optical modules (pluggable transceiver modules) are being used in line cards on various network devices (e.g., switches, routers, etc.). Optical modules come in many different form factors such as SFP (Small Form-Factor Pluggable), QSFP (Quad Small Form-Factor Pluggable), QSFP+, QSFP-DD (QSFP Double Density), OSFP (Octal Small Form-Factor Pluggable), and the like, and may support data rates up to 400 Gb/s (or higher), for example. The optical modules operate as an engine that converts electrical signals to optical signals or in general as the interface to the network element copper wire or optical fiber. Hosts for these pluggable modules include line cards used on switches, routers, edge products, and other network devices. In conventional systems, cooling of optical modules for advanced Ethernet speeds typically requires liquid cooling for higher power applications or lower power applications in dense implementations.

Access points are often limited in power, size, and weight. Due to these limitations, heatsinks are typically not used. Limited cooling, along with power, size, and weight restrictions, make it difficult to add functionality such as an offload engine, radar processing functions, or USB-C connections to conventional access points.

The embodiments described herein implement microelectromechanical systems (MEMS) to drive airflow through (over, under, past) a network device component (e.g., optical (optics) module such as QSFP-DD or other form factor, offload engines such as radar systems or other operation intensive components in an access point, or other heat generating component). In one or more embodiments, a MEMS module (MEMS cooling tray, module MEMS) is removably positioned adjacent to the network device component to pull air across the component. In one or more embodiments, an OIR (Online Installation and Removal) system allows for removal and replacement of the MEMS module without impacting system operation. In one or more embodiments, a Pulse Width Modulation (PWM) power unit provides granular control of the MEMS module.

The term "heat generating component" as used herein may refer to any electrical, optical, or electrical/optical device or circuitry (e.g., high power component, increased performance component) in which heat dissipation capability of the component is insufficient to moderate its temperature, including for example, optical modules, offload processing engines, AP components, or other devices that generate excess heat and thus need thermal management to prevent failure and improve reliability.

In one or more embodiments, a MEMS module may be integrated with an optical module and inserted into an optical module cage. In one or more embodiments, the optical module cage is a stacked configuration to accommodate multiple optical modules, MEMS modules (cooling trays), or integrated optical modules and MEMS modules. In one or more embodiments, the MEMS module is operable to remove dissipated heat from 20 Watts to over 80 Watts optical module applications (e.g., QSFP-DD or other form factor). In one example, MEMS cooling may be used to maintain a component temperature of less than 74° C. without the use of liquid cooling.

In one or more embodiments, the MEMS module may be used to cool offload engines such as radar systems, video conference applications (e.g., WebEx), or other components without the use of heatsinks. In one or more embodiments, the MEMS cooling provides for replacement of key functions without additional module height that is needed for heatsinks. In one or more embodiments, the MEMS cooling provides for AP operation with four times the power of a conventional AP with minimal weight increase. For example, in one or more embodiments, MEMS cooling may be used to dissipate over 90 watt PoE (Power over Ethernet) in an AP without heatsinks or the need to create a larger size AP. In another example, MEMS cooling may be used to cool 90 watt USB-C systems. In one or more embodiments, MEMS cooling may be used to dissipate more than 100 watts using FMP (Fault Managed Power)/ESP (Extended Safe Power), as described in U.S. patent application Ser. No. 16/805,580 ("Multi-Phase Pulse Power Short Reach Distribution"), filed Feb. 28, 2020, which is incorporated herein by reference in its entirety.

The embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, power sourcing equipment, powered devices, or other network devices), which facilitate passage of data within the network. One or more of the network devices may comprise one or more optical modules cooled by MEMS cooling described herein with respect to FIGS. 3-9. The network device may further include any combination of memory, processors, power supply units, and network interfaces. The network interface may comprise any number of interfaces (line cards, ports) for receiving data or transmitting data to other devices. The network interface may include, for example, an optical interface at an optical module. In one or more embodiments, the network device comprises an access point in a wireless network. One or more components of the access point may be cooled by the MEMS cooling as described herein with respect to FIGS. 10-11.

Referring now to the drawings, and first to FIGS. 1A-1D, a MEMS block (device, element, array) 10 that may be used to dissipate heat from a heat generating component (e.g., optical module, access point component) of a network device (e.g., switch, router, line card or fabric card installed in switch or router, access point, server) is shown, in accordance with one embodiment. FIG. 1A is front view showing a plurality of exhaust ports (air exhaust) 12 and FIG. 1B is a rear view showing a plurality of air inlet ports (air entrance) 14. FIGS. 1C and 1D are top and bottom perspectives, respectively, of the MEMS block 10 shown in FIGS. 1A and 1B with a power unit (e.g., PWM (Pulse Width Modulation) power module) 16 coupled to the MEMS block 10. The MEMS block 10 and power unit 16 are referred to herein as a MEMS module 15.

It should be noted that the terms lower, upper, bottom, top, below, front, rear, above, horizontal, vertical, and the like, which may be used herein are relative terms dependent upon the orientation of the network device and components and should not be interpreted in a limiting manner. These terms describe points of reference and do not limit the embodiments to any particular orientation or configuration.

In one or more embodiments, an apparatus comprises the MEMS module 15 comprising a plurality of air movement cells 19a (FIG. 1C) and a power unit 16 operable to control the plurality of air movement cells, and a housing (e.g., optical module cage, access point) configured for slidably receiving the MEMS module 15 and positioning the MEMS module adjacent to the heat generating component of the network device. The MEMS module 15 is operable to dissipate heat from the heat generating component and is configured for online installation and removal during operation of the heat generating component.

As described below, the MEMS module 15 (also referred to a MEMS cooling tray) may be slidably inserted into and removed from the network device at a location immediately adjacent to the heat generating component to dissipate heat using MEMS technology. The MEMS block 10 transfers heat generated by the component where heat dissipation capability of the heat generating component is insufficient to moderate its temperature.

The MEMS block 10 comprises any number of MEMS arrays (units) 19 (e.g., 1, 2, 3, 4, 5, 6 . . . ), which may be individually controlled by the power unit 16 (FIG. 1A). Each MEMS array 19 may comprise one or more air movement cells (heat dissipation cells, cooling cells) 19a operable to create air pressure and air movement to dissipate heat away from the heat generating device, thereby providing cooling (FIG. 1C). Each air inlet 14 may provide air to any number of cells 19a and each cell may distribute air to one or more air exhaust 12, with the cells arranged in any format. In one example, the cell 19a comprises a piezoelectric plate 19b or other suitable structure (e.g., one or more diaphragms) electrically coupled to the power unit 16 to drive the piezoelectric plate upward and downward as indicated by dashed lines in the enlarged cutout view of FIG. 1C. The power unit 16 actuates the plate 19b to vibrate between the positions shown in FIG. 1C. Vibration of the plate 19b pulls fluid (e.g., air) into the cell 19a (at air inlet 14) and drives fluid out of the cell (at air exhaust 12). The plate 19b may be operable to drive fluid from one side of the plate to the other (e.g., permeable material, orifices). In one or more embodiments, a thin film temperature sensor may be used to provide control feedback for the individual cells or groups of cells. The MEMS block 10 may comprise any number or type of MEMS cooling components in any arrangement.

In the example shown in FIGS. 1C and 1D, one end of the MEMS block 10 comprises a status indicator 17 (e.g., LED (Light Emitting Diode)) and an OIR (Online Insertion and Removal) switch (button) 18. As described below, the MEMS module 15 may be replaced independently from the optical module (or other heat generating component) with an OIR method to control replacement of the MEMS module. The power unit 16 is connected to an opposite end of the MEMS block 10 and may provide granular control of the MEMS block (e.g., individual cell/MEMS array/MEMS group control). As described below with respect to FIG. 2, the power unit 16 may include one or more power connections 11 (e.g., DC (Direct Current) power input) or data connections 13 (e.g., SPE (Single Pair Ethernet) connection). The power and data connections 11, 13 may be located on one or both sides of the power unit 16 or along an edge of the power unit.

FIG. 2 is block diagram illustrating a circuit, generally indicated at 20, of the power unit 16 (FIGS. 1C and 1D), in accordance with one embodiment. In the example shown in FIG. 2, the power unit comprises a PWM (Pulse Width Modulation) power module comprising a power filter 21, a step-down device (DC-DC step-down converter) 22, a microprocessor (µP) 23, and a PWM controller 24. The power unit may receive, for example, 12 VDC (or other IBV (Intermediate Bus Voltage)) at the power filter 21. The power is transmitted to the microprocessor 23 and PWM controller 24 after passing through the step-down device 22. In addition to receiving the power, the microprocessor 23 communicates over SPE (Single Pair Ethernet), or other suitable communications protocol at block 25. In one or more embodiments, the power unit may also be configured for MDIO (Management Data Input/Output) or I2C (Inter-Integrated Circuit)). As shown in FIG. 2, the PWM controller 24 may provide a MEMS fail signal to the microprocessor 23 based on monitoring of each MEMS unit (e.g., through one or more sense resistors R). For example, the PWM controller 24 may include a current sense to monitor for a MEMS failure, thereby allowing the microprocessor 23 to communicate status to system software using SPE. The PWM controller 24 controls operation of any number of MEMS units (and cooling/air movement cells) (MEMS$_1$ . . . MEMS$_N$). In one example, the PWM power unit may be configured to provide pulse DC at a frequency of 20 kHz to 100 kHz. The frequency range may be programmable.

The microprocessor 23 also receives input from the OIR switch 18, which may be actuated prior to removal of the MEMS module 15, and provides an output signal to the LED indicator 17 when it is safe to remove the MEMS module (FIGS. 1C and 2). For example, upon receiving an OIR signal, the PWM controller 24 may flash the LED when it is safe to remove the MEMS module 15. The microprocessor 23 also receives a signal from a temperature monitor at (e.g., on or near) the heat generating component, which may be used to indicate if the component is below a specified temperature so that the microprocessor 23 can send a signal to the LED indicator to indicate that it is safe to remove the MEMS module. When the MEMS module 15 is removed, the heat generating component is without air flow. The temperature monitor may be used to indicate if the temperature at the heat generating component has exceeded a predefined limit during OIR of the MEMS module, in which case the controller (or a controller at the network device) may modify an operating condition of the heat generating component (e.g., reduce power, turn off) to prevent damage to the component. Once the MEMS module is inserted and the temperature has lowered to an acceptable level, the heat generating component may resume normal operation. During normal operation, the PWM controller 24 may monitor the temperature and adjust airflow as needed. For example, the MEMS module 15 (or one or more MEMS units) may be powered down during periods of lower operating temperature. It is to be understood that the circuit 20 shown in FIG. 2 is only an example and changes may be made to the number, type, or arrangement of components at the power unit without departing from the scope of the embodiments.

Figure 3:
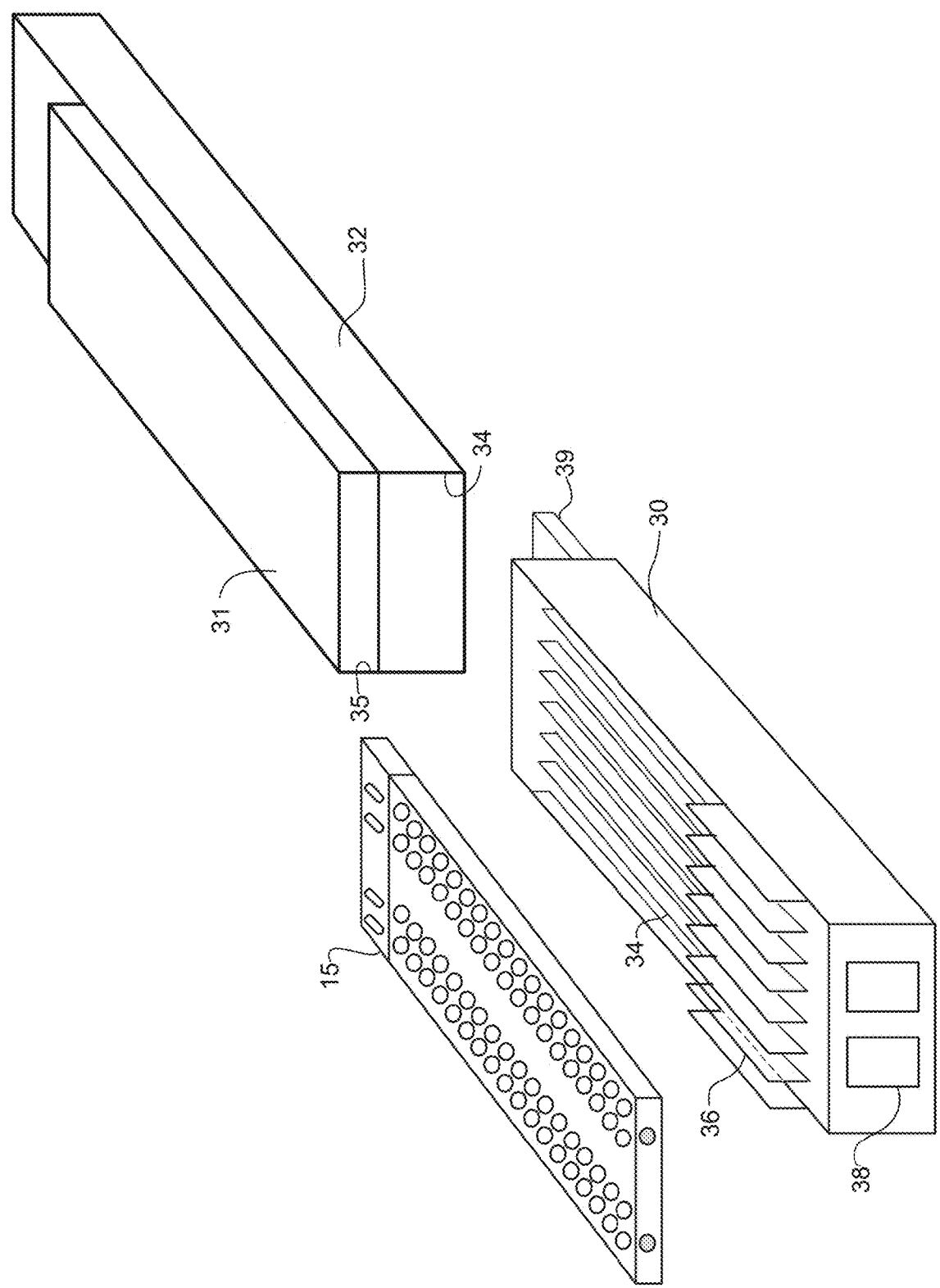
FIG. 3 is a perspective of the MEMS module of FIG. 1C, an optical module, and optical module cage, in accordance with one embodiment.

FIG. 3 shows the MEMS module 15, an optical module 30, and optical module cage 32, in accordance with one embodiment. The optical module cage 32 (housing, structure) is configured for receiving the optical module 30 (pluggable module, optics modules, pluggable optical module, optical transceiver (e.g., SFP, OSFP, QSFP, QSFP+, QSFP-DD, and the like)).

As shown in FIG. 3, the optical module cage 32 comprises a first (lower) opening 34 for receiving the optical module 30 and a second (upper) opening for receiving the MEMS module (MEMS cooling tray) 15. The MEMS module 15 is configured to be slidably inserted into or removed from the optical module cage 32 to provide an OIR function, as previously described. An upper surface 31 of the optical module cage 32 may be open or include a plurality of openings to allow air flow from the air exhaust 12 at the MEMS module 15 from the optical module cage.

The optical module cage comprises a connector (interface) for connecting the optical module with electronic components on a line card or other electronic component operable to utilize transceivers and interface with a telecommunications network. The optical module cage may be configured with a high speed connector and power connector. In one or more embodiments, the optical module cage 32 may be located within a line card or fabric card. The optical modules are coupled to electronic components (e.g., one or more integrated circuit cards mounted on one or more circuit boards along with supporting components). The electronic components and circuits may be operable to interface telecommunication lines (e.g., copper wire, optical fibers) in a telecommunications network. The line card may be configured to perform one or more operations and receive any number or type of pluggable transceiver modules configured for transmitting and receiving signals, and may be configured for operation in any type of chassis or network device.

The optical module 30 comprises two front connectors 38 (e.g., LC or another suitable connector). The other end comprises an optical module cage interface 39. The pluggable optical module 30 may be configured to support gigabit Ethernet, Fibre Channel, or other communication standards.

In one or more embodiments, the optical module 30 may include raised ribs (fins) 36 located along an upper surface at one end of the optical module, which extends from the optical module cage and remains external to the cage. A portion of the optical module that is inserted into the optical module cage 32 may include slightly raised ribs 34, with a profile that fits within the optical module cage 34. The ribs define a plurality of air flow channels.

Figure 4:
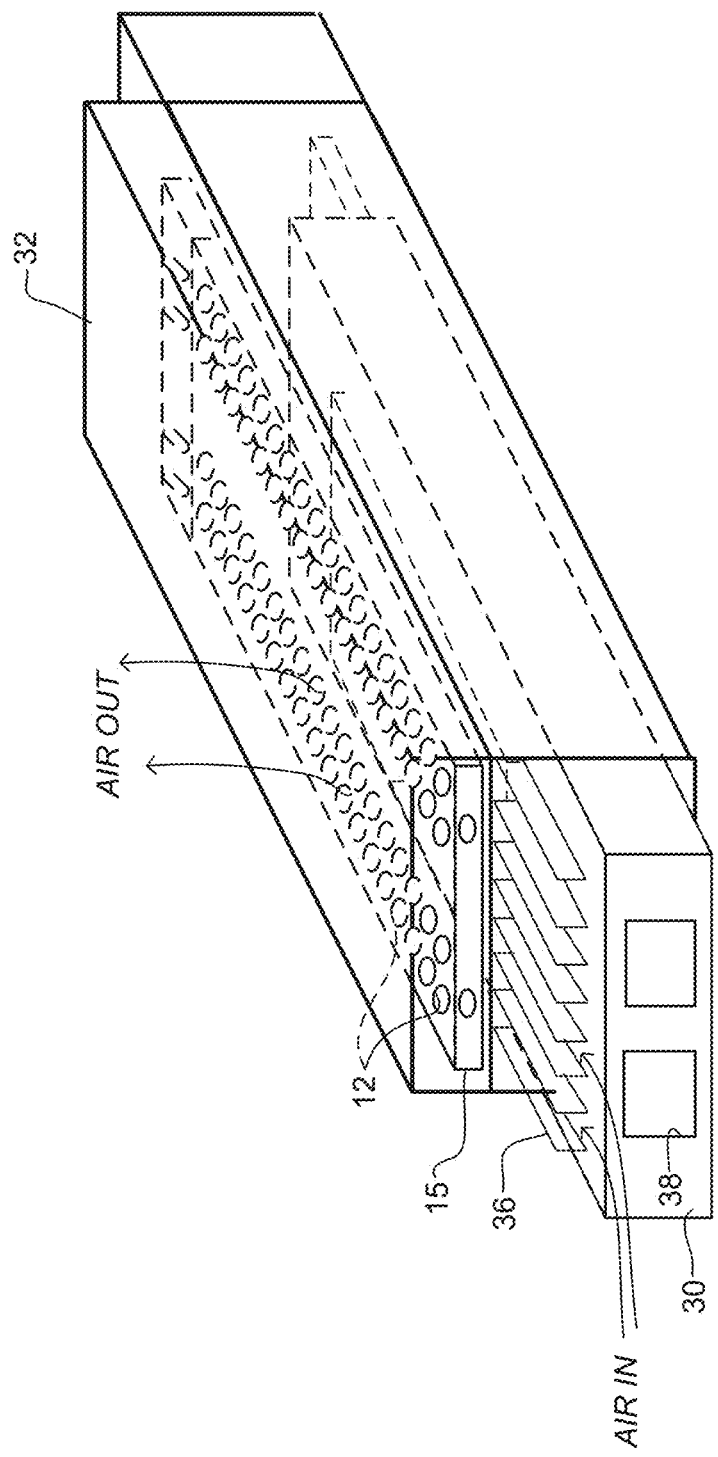
FIG. 4 is a perspective of the MEMS module and optical module of FIG. 3 inserted into the optical module cage.

FIG. 4 is a perspective illustrating the MEMS module 15 and optical module 30 inserted into the optical module cage 32. As indicated by the arrows in FIG. 4, air flow enters through the airflow channels defined by the ribs 36, passes through the MEMS module 15, and exits from the top of the optical module cage 32. Cool air entering through the airflow channels is pulled into the air inlet 14 of the MEMS module 15 and hot air exits through the air exhaust 12, thereby dissipating heat generated by the optical module 30 (FIGS. 1C, 1D and 4). As previously described, the MEMS module 15 creates air pressure and movement to dissipate heat from the high power optical module 30. The optical module cage 32 may include any number of openings in an upper surface to allow for air flow, as described below with respect to FIGS. 7 and 8.

Figure 5:
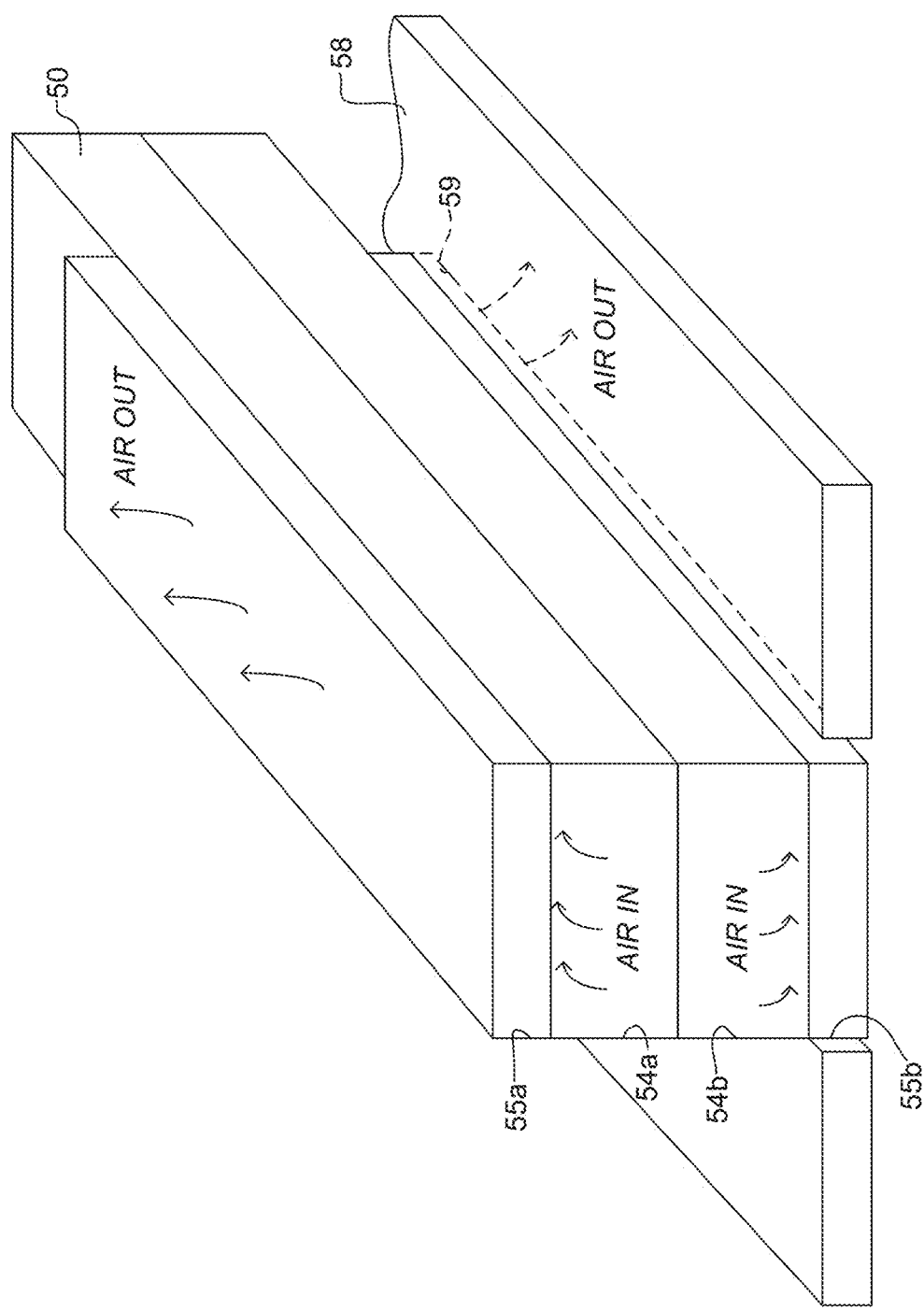
FIG. 5 is a perspective of a stacked optical module cage with openings for receiving optical modules and MEMS modules, in accordance with one embodiment.
Figure 6:
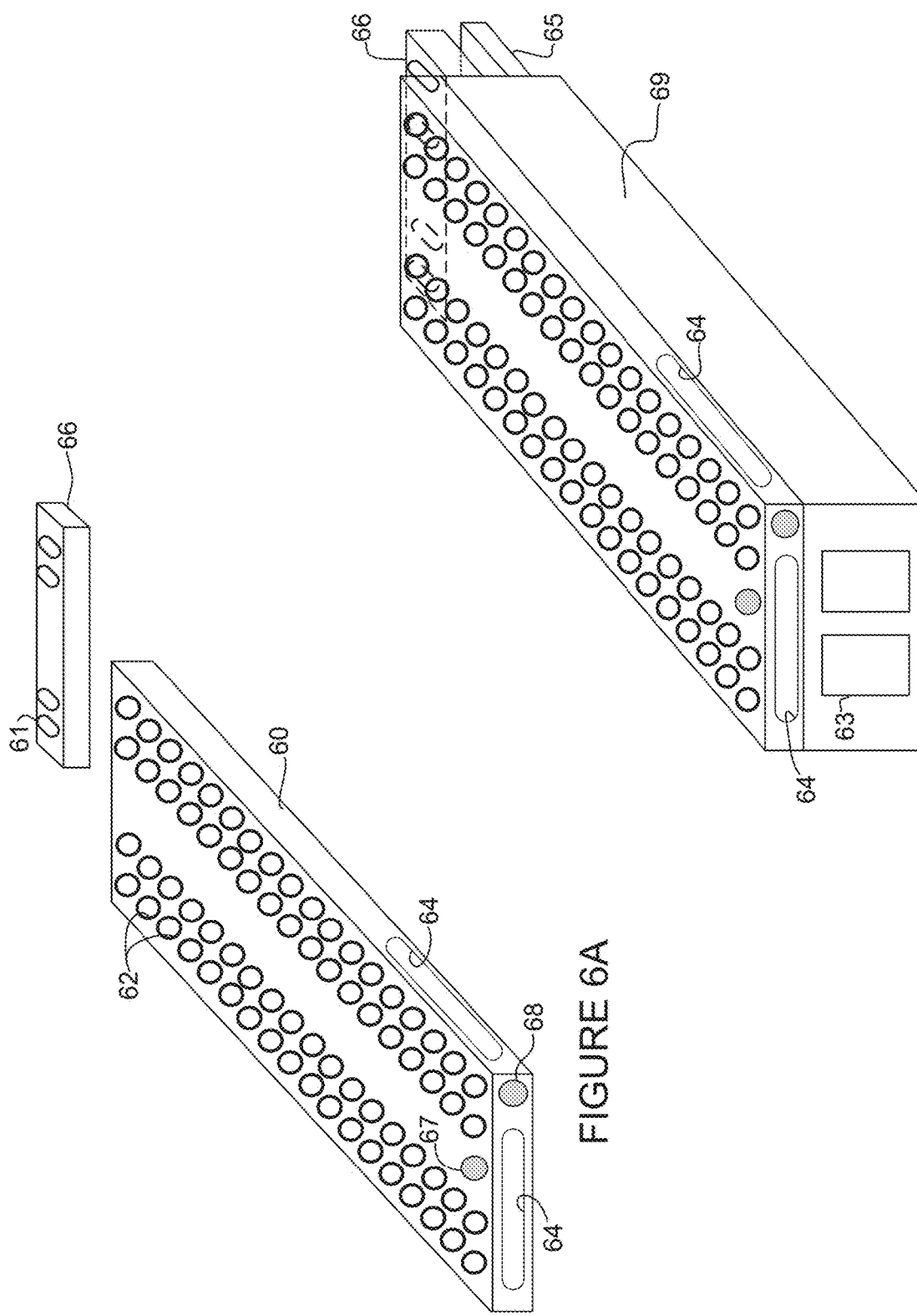
FIG. 6A is a perspective of a MEMS block and power unit, in accordance with one embodiment.
FIG. 6B is a perspective of the MEMS block and power unit of FIG. 6A integrated with an optical module, in accordance with one embodiment.

FIG. 5 shows a dual optical module cage 50, in accordance with one embodiment. The dual optical module cage 50 includes two optical module openings 54*a*, 54*b* and two MEMS module (MEMS cooling tray) openings 55*a*, 55*b*. The optical module cage 50 is shown mounted on a printed circuit board (PCB) 58 with a cut-out 59 for receiving the dual optical module cage 50. The PCB cut-out 59 provides for low profile mounting and allows two optical modules to be cooled at a maximum dissipation rate. In this example, the MEMS modules are positioned above and below the optical modules. Air flow for the first (upper) optical module exits from the top side and air flow for the second (lower) optical module exits from the bottom side of the printed circuit board 58.

The optical module cage may include any number of openings for receiving optical modules in a stacked or side-by-side arrangement (e.g., 2×1 (two rows with one module in each row) (stacked) (as shown in FIG. 5), 1×2 (1 row with two modules) (side-by-side), 2×2 (two rows, two modules in reach row), 2×4 (two rows, four modules in each row), etc.). Each optical module cage opening in the optical module cage may be configured with an adjacent opening for insertion of the MEMS module 15 adjacent to the optical module, or only some of the openings may be configured for use with the MEMS module (e.g., no MEMS module for lower power optical modules).

The term "stacked" as used herein refers to one module positioned in a location vertically above another module and the term "side-by-side" as used herein refers to two modules positioned horizontally adjacent to one another. As previously noted, the terms above/below, upper/lower, top/bottom, horizontal/vertical, or front/rear as used herein are relative to the position of the cage and also cover other orientations of the cage. Thus, the terms are used only for ease of description and are not to be interpreted as limiting the arrangement of openings or components within an optical module cage.

FIG. 6A is a perspective of a MEMS module configured for integration with an optical module. As shown in FIG. 6A, the MEMS module comprises a MEMS block 60 comprising a plurality of openings 62 defining an air exhaust and air inlets 64 formed within an edge and one or both sides of the MEMS block 60. The MEMS block further includes an indicator (LED indicator) 67 and OIR switch (button) 68. In this example, the LED indicator 67 is located on a front edge margin of an upper surface of the MEMS block 60. A power unit 66 comprises power inputs 61 and one or more data connection (e.g., SPE interface) (not shown).

FIG. 6B shows the MEMS module (MEMS block 60 and power unit 66) integrated with an optical module 69, in accordance with one embodiment. In this example, the power unit 66 is mounted on the optical module, offset from the MEMS block 60, however, it may also be mounted inline with the MEMS block as previously described. The MEMS block 60 may include any number of air inlets 64. In the example shown in FIGS. 6A and 6B, the air inlets 64 are positioned towards a front of the MEMS block 60 to receive air flow at the open end of the optical module cage, as described below with respect to FIG. 8. The optical module includes optical connectors 63 (e.g., LC connectors) and optical module cage interface (electrical connector) 65.

Figure 7:
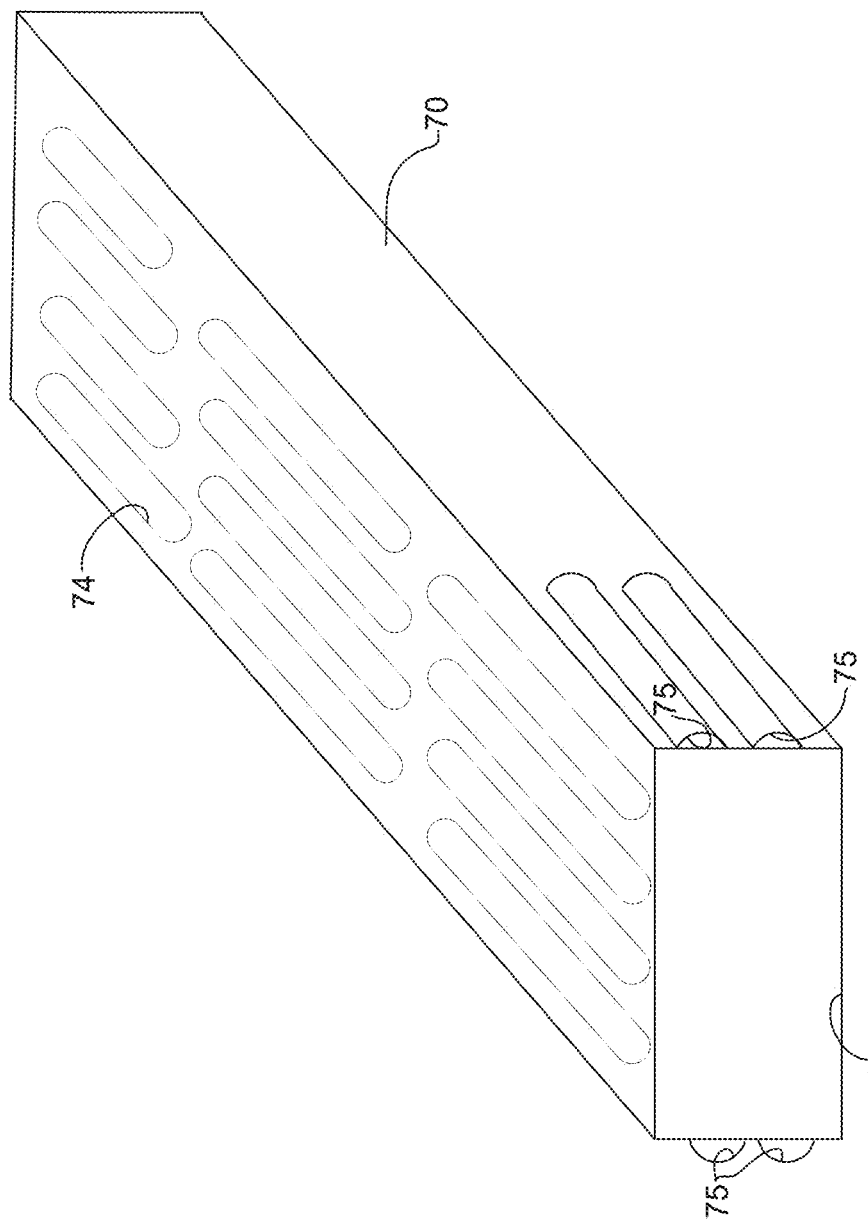
FIG. 7 is a perspective of an optical module cage for receiving the optical module with integrated MEMS module, in accordance with one embodiment.
Figure 8:
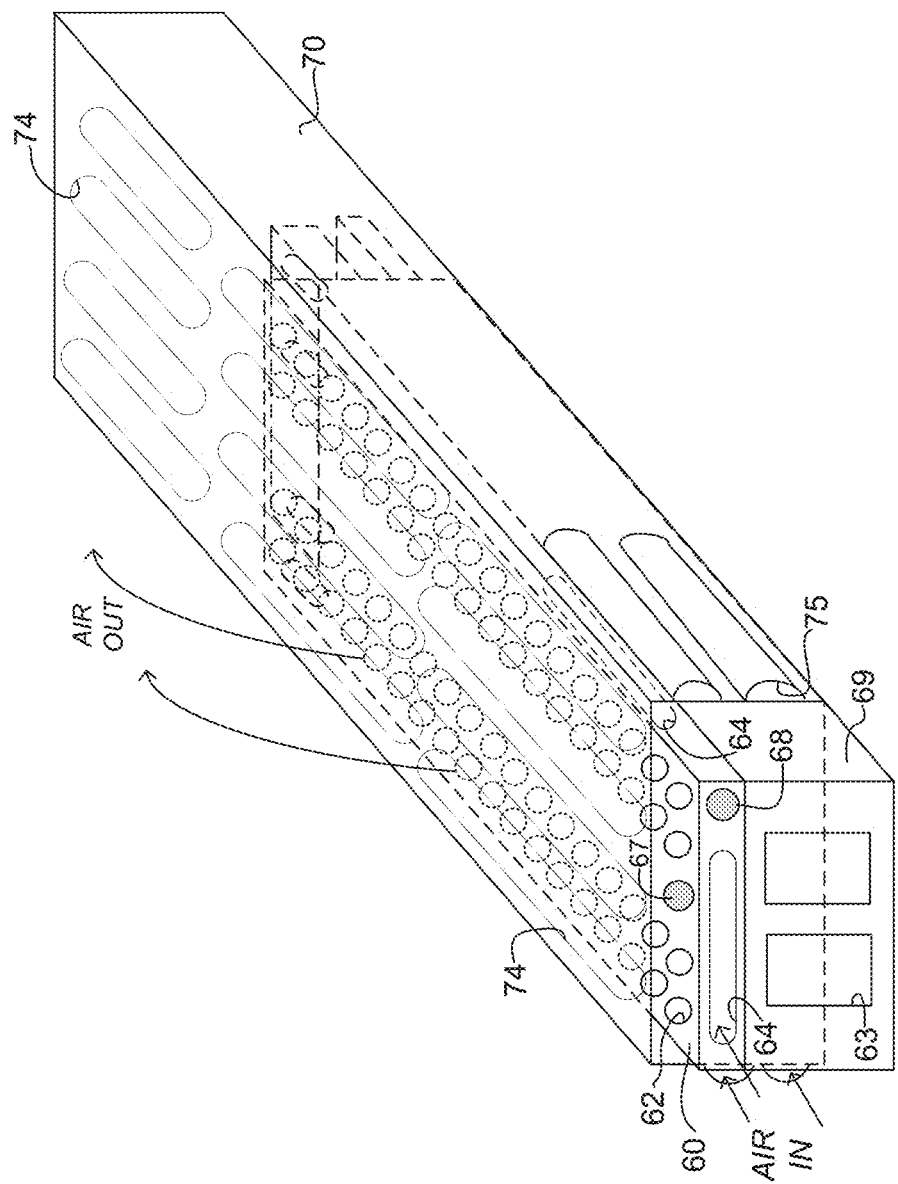
FIG. 8 is a perspective of the optical module with integrated MEMS module of FIG. 6B inserted into the optical module cage of FIG. 7.

FIG. 7 is a perspective of an optical module cage 70 for receiving the optical module with integrated MEMS module shown in FIG. 6B. In the example shown in FIG. 7, the optical module cage includes a plurality of air flow openings 74 in an upper surface of the optical module cage for flow of hot air exiting the MEMS block. The optical module with integrated MEMS module is inserted into opening 76 as shown in FIG. 8. A plurality of side air inlets 75 (two on each side in the example shown in FIG. 7) are formed on one or more sides of the optical module cage for additional air flow into the cage. There may be openings formed in a side wall of the optical module cage at the location of the side air inlets 75 or material may be removed from the optical module cage at the area of the side air inlet tube.

FIG. 8 illustrates the optical module with integrated MEMS module of FIG. 6B inserted into the optical module cage 70 of FIG. 7. Air enter through openings 64 in the MEMS block 60 and air inlet tubes 75 on the optical module cage 70 and exits from the MEMS block 60 at air exhaust openings 62 and through an upper surface of the optical module cage at openings 74.

In this example, the LED status indicator 67 is located on a top edge of the MEMS block 60, which extends from the optical cage 70 and is therefore viewable. The LED indicator 67 may be used to indicate a failure at the MEMS module, for example. The OIR button 68 is located on a front edge of the MEMS block 60 for ease of access. The OIR button may be used to indicate an intent to remove the optical module with the integrated MEMS module so that the microprocessor can communicate to the system software.

It is to be understood that the optical module with integrated MEMS module and optical module cage shown in FIG. 8 is only an example and changes may be made without departing from the scope of the embodiments. For example, the air inlets or outlets on the MEMS block 60 or optical module cage 70 may have a different size, shape, or location. Also, it is to be understood that the spacing between the MEMS block and an internal surface of the optical module cage or shape and size of the optical module or optical cage may be different than shown.

Figure 9:
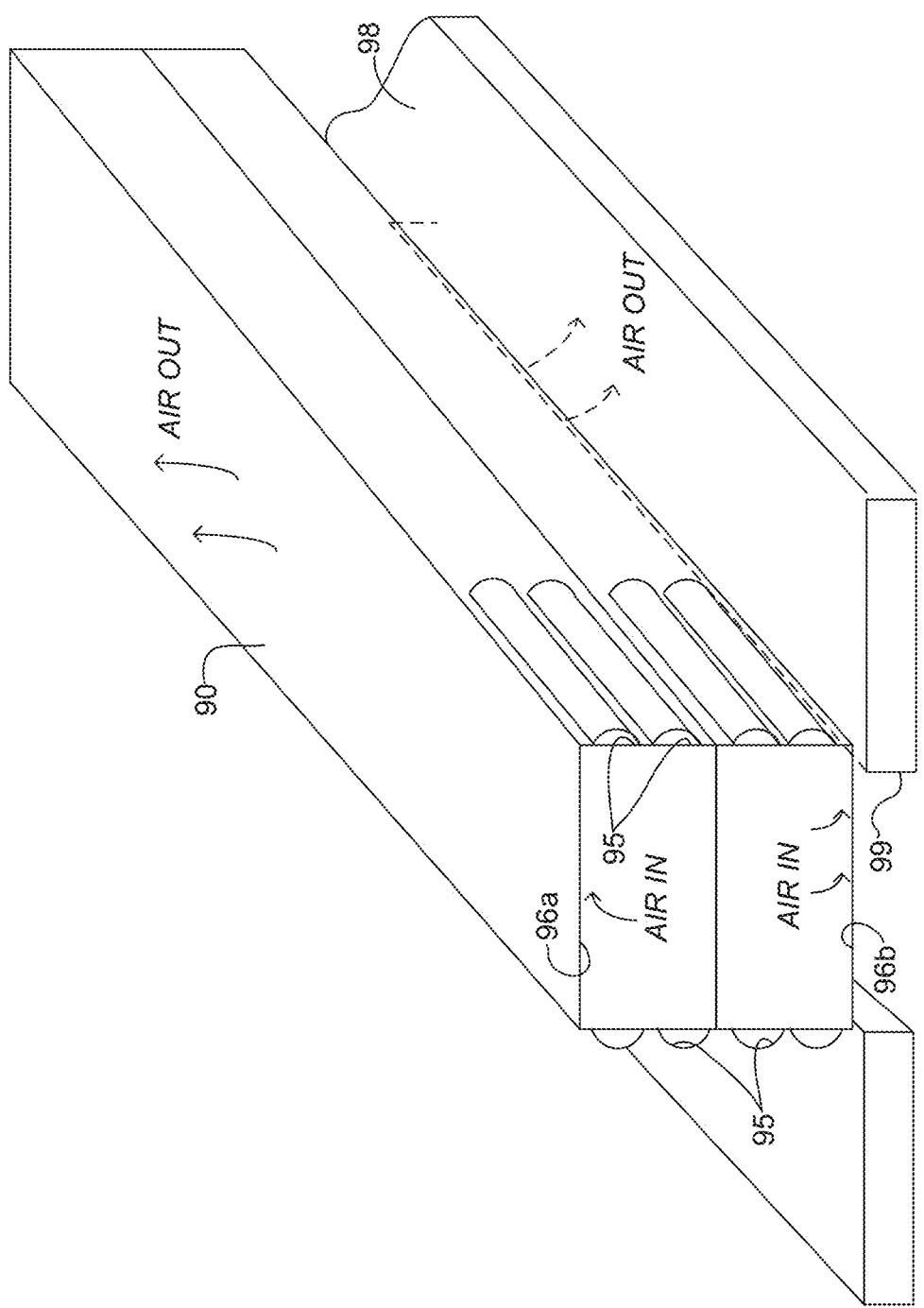
FIG. 9 is a perspective of a stacked optical module cage for receiving optical modules with integrated MEMS modules, in accordance with one embodiment.

FIG. 9 illustrates an example of a stacked optical module cage 90 for receiving two of the optical modules with integrated MEMS modules of FIG. 6B in a stacked arrangement. In this example, the optical module cage 90 comprises two openings 96a, 96b for receiving two optical modules with integrated MEMS modules. The dual optical module cage 90 includes side air inlet tubes 95 for additional air flow. As previously described with respect to FIG. 5, PCB 98 may include a cut-out 99 for additional cooling. Air exits through an upper surface and lower surface of the optical module cage, which may include one or more openings for airflow. The optical cage 90 may be configured for receiving any number of optical modules or optical modules with integrated MEMS modules in any arrangement.

It is to be understood that the configurations shown and described above are only examples and changes may be made without departing from the scope of the embodiments. The optical module and optical module cage may be designed for compatibility with various optical form factors including SFP, QSFP, OSFP, CFP, CFP2, CFP8, QSFP-DD, or any other current or future form factor.

Figure 10:
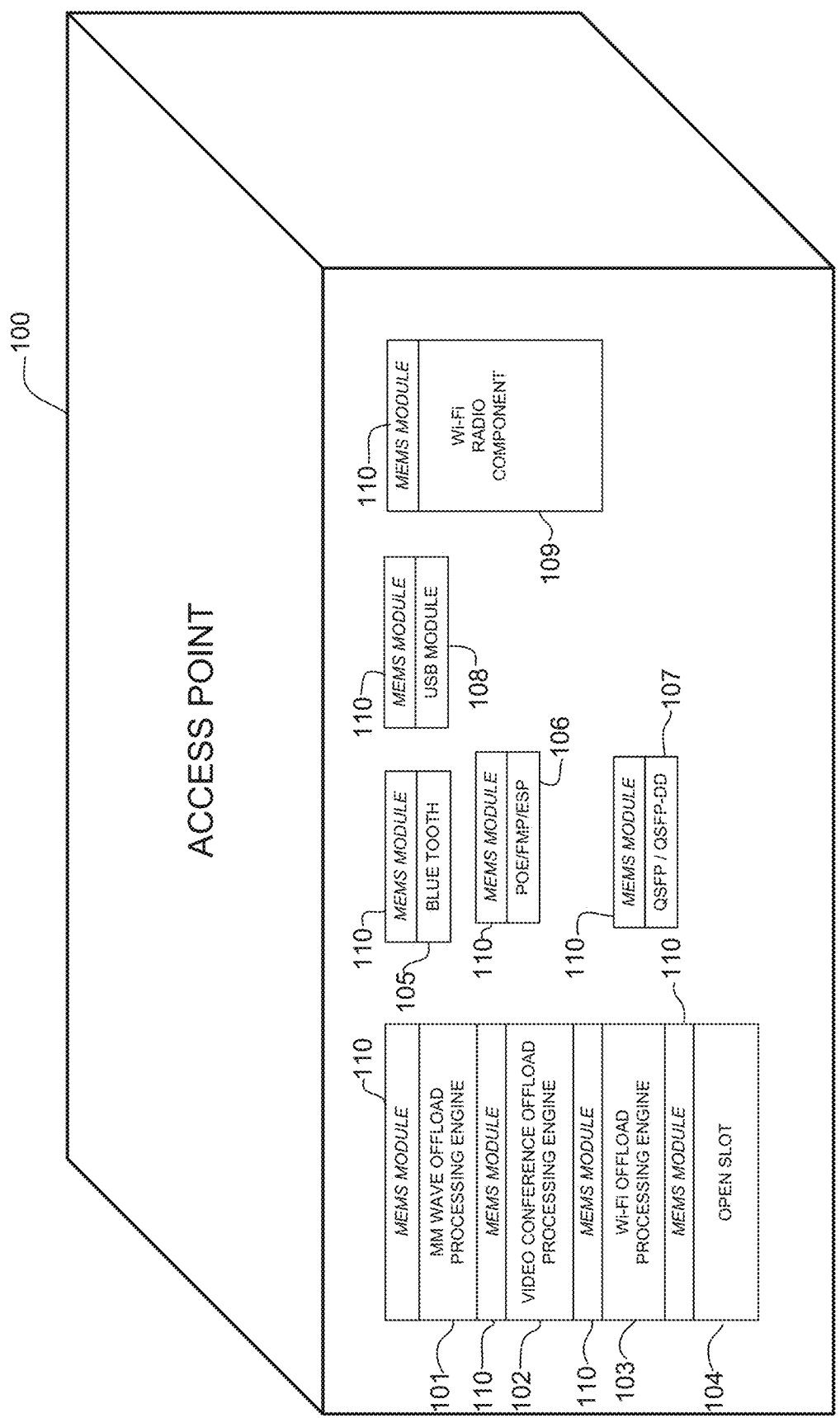
FIG. 10 is a block diagram of an access point comprising a plurality of MEMS modules for cooling components of the access point, in accordance with one embodiment.

As previously noted, the heat generating component may also include a component of an access point. FIG. 10 is a block diagram of a higher power access point 100 (e.g., 90 watts, >90 watts) with MEMS cooling, in accordance with one embodiment. The AP may be configured for multigigabit (mGig) speeds. In one example, the AP is powered with 90 watt PoE. In another example, the AP is powered with FMP/ESP. The MEMS cooling system allows for advanced AP functions without the need for heatsinks, thereby providing a significant weight reduction. The AP 100 comprises a plurality of replaceable modules and MEMS modules (cooling trays, cooling elements) 110 (e.g., MEMS block 10 and power unit 16 shown in FIG. 1C). The MEMS module 110 may rest on a CPU multi-core (e.g., two cores) offload engine, for example, or any other heat generating component. The MEMS module and components may be received in a housing as described above with respect to FIGS. 3, 5, 7, and 9, for example. In the example shown in FIG. 10, multiple AP components are positioned adjacent to the MEMS module 110 for dissipating heat from the AP components. In another example, more than one MEMS modules may be used to cool an offload engine (component) or more than one AP component may be cooled with the same MEMS module. In the example shown in FIG. 10, the AP components include an mmWave (millimeter Wave) offload processing engine 101, a video conference offload processing engine 102, a Wi-Fi offload processing engine 103, a Bluetooth module 105, a PoE/FMP/ESP module 106, a pluggable optical module as previously described (e.g., QSFP, QSFP+, QSFP-DD, and the like) 107, a USB module 108, and a Wi-Fi radio component 109. The offload engine is used to offload processing from another device at the AP. An open slot 104 is also shown for receiving another AP component.

It is to be understood that the components and arrangement of the components and MEMS modules shown in FIG. 10 is only an example, and the access point 100 may include any number or type of components and MEMS modules in any arrangement.

Figure 11:
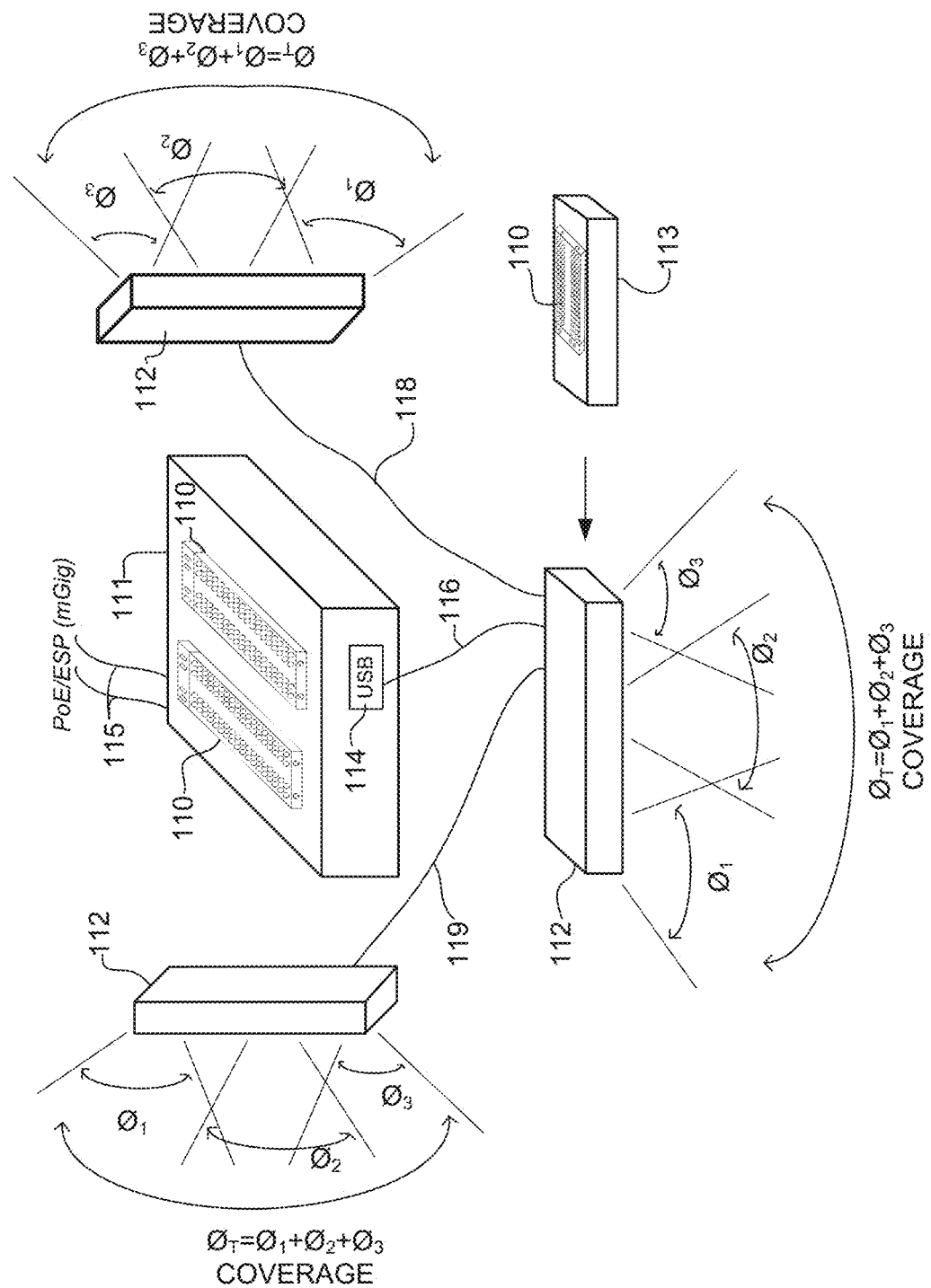
FIG. 11 illustrates the access point in a millimeter wave (mmWave) network, in accordance with one embodiment.

FIG. 11 shows an access point 111 (e.g., 90 watt AP) with mmWave (millimeter wave) and offload engines (e.g., WebEx, imaging) implemented with the MEMS cooling system. The AP 111 is in communication with one or more mmWave arrays (mm bar) 112 (three shown in FIG. 6), with each mmWave array configured for a specified coverage ($\theta_1 = \theta_1 + \theta_2 + \theta_3$). The mmWave arrays 112 may be in communication with a USB 114 at the AP over a power and communications connection 116. The mm bars 112 may be in communication over a USB connection 118, 119, for example. An offload engine 113 (microprocessor/DSP (Digital Signal Processor)) is coupled to the mmWave array 112 (e.g., USB connection, slidably inserted, plugged in). The offload engine 113 includes a MEMS module 110 for cooling the component. The AP may receive power from one or two 90 watt PoE connections or an ESP source (100 watts or more). In one example, each mm bar 112 may utilize about 8 watts. With a 90 watt budget, the system may include, for example, four mm bars 112, one microprocessor 113, and two cables for communications. The system may be configured, for example, for 1G SPE with 45 watts or standard four pair 90 W PoE. As shown in FIG. 11, the AP may include any number of MEMS modules 110 for cooling any number of AP functions (components).

It is to be understood that the network shown in FIG. 11 is only an example, and the network may have a different configuration with a different number or type of components or different power levels, without departing from the scope of the embodiments.

Figure 12:
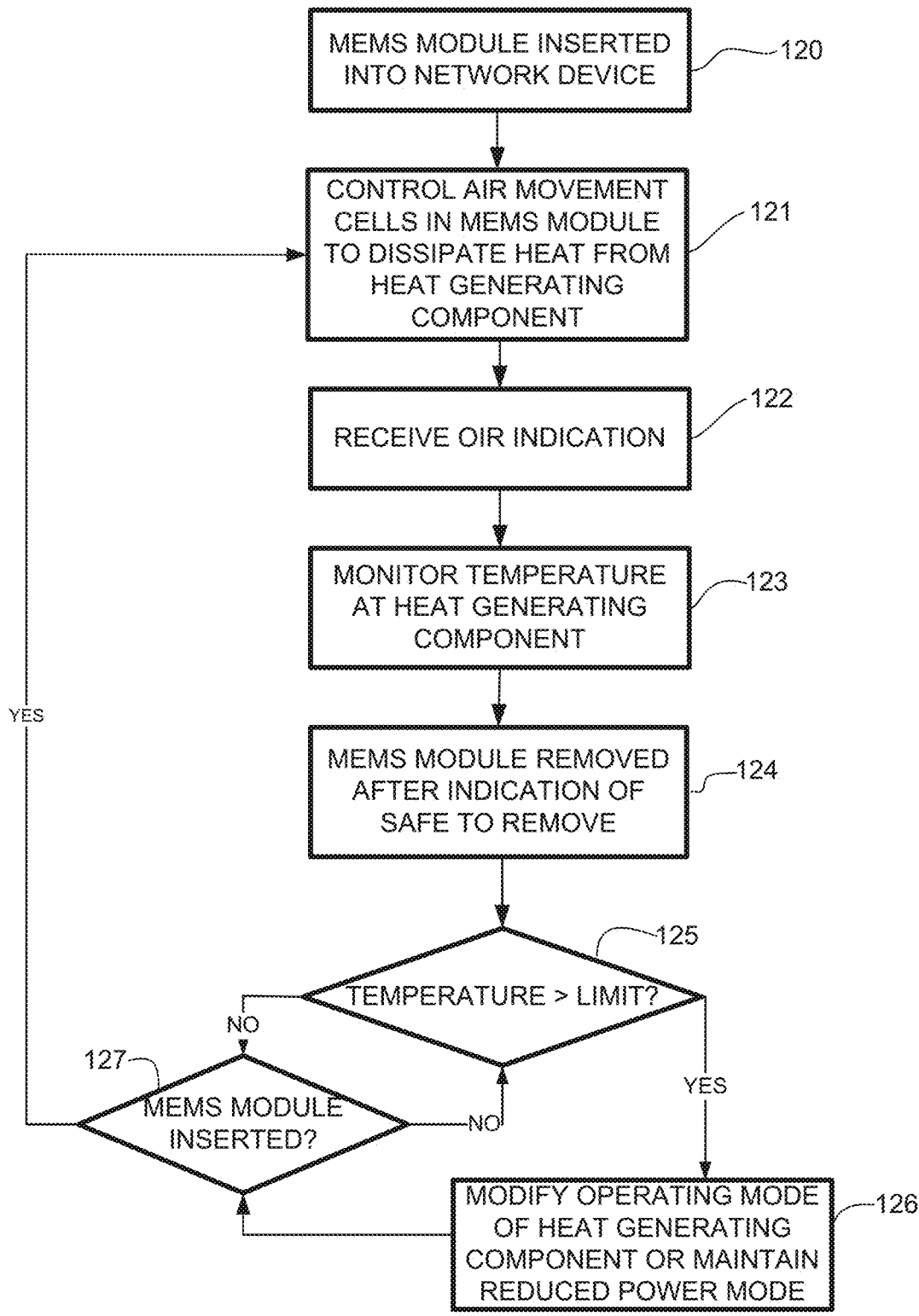
FIG. 12 is a flowchart illustrating an overview of a process for cooling with the removable MEMS module, in accordance with one embodiment.

FIG. 12 is a flowchart illustrating an overview of a process for cooling heat generating components (e.g., optical modules, AP components) in a network device, in accordance with one embodiment. A MEMS cooling tray (e.g., MEMS module 15) comprising a plurality of air movement cells 19a is inserted into a network device to cool a heat generating component (step 120) (FIGS. 1C and 12). A power unit controls the air movement cells to cool the heat generating component positioned adjacent to the MEMS module (step 121). In one or more embodiments, a controller at the power unit may receive an OIR indication (e.g., OIR button 18 pushed) to indicate an intent to remove the MEMS module (step 122). The temperature is monitored at the heat generating component (step 123) and in one or more embodiments, an indication that the MEMS module is safe to remove may be provided. The MEMS module is then removed (step 124). If the temperature exceeds a predetermined limit (step 125), an operating mode of the heat generating component may be modified (e.g., reduce power to component, turn off component) (step 126). If the temperature stays above the limit, the component remains off or in a reduced power state. If the MEMS module is reinserted (or a new MEMS module inserted) (step 127) the MEMS module is used to cool the component (step 121). The temperature may continue to be monitored, and if the temperature falls below the limit before the new MEMS module is inserted, the component may be turned back on.

It is to be understood that the process shown in FIG. 12 and described above is only an example and steps may be removed, added, modified, or combined, without departing from the scope of the embodiments. For example, the temperature monitoring may be used to turn off one or more MEMS modules or MEMS units if the temperature falls below a specified threshold. In another example, the OIR switch may be removed and a sensor used to indicate removal of the MEMS module.

Although the apparatus and method have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A method comprising:
controlling at a power unit, a plurality of air movement cells in a microelectromechanical system (MEMS) module to cool a heat generating component positioned adjacent to the MEMS module; and
receiving an indication of removal of the MEMS module;
monitoring a temperature at the heat generating component; and
modifying an operating mode of the heat generating component upon the temperature exceeding a predetermined limit.

2. The method of claim 1, wherein receiving an indication of removal of the MEMS module comprises receiving input from an online installation and removal switch and signaling an indicator to provide an indication that is it safe to remove the MEMS module based on the temperature.

3. The method of claim 1, further comprising receiving power and SPE (Single Pair Ethernet) at the power unit.

4. The method of claim 1, wherein the power unit comprises a pulse width modulation power controller operable to individually control one or more of the air movement cells.

5. The method of claim 1, wherein the heat generating component comprises an optical module and wherein the MEMS module and the optical module are removably inserted into an optical cage module.

6. The method of claim 1, wherein the heat generating component comprises an offload engine at an access point.

7. An apparatus comprising:
a power unit including a microelectromechanical system (MEMS) module having plurality of air movement cells configured to cool a heat generating component positioned adjacent to the MEMS module; and
a controller coupled to the MEMS module and to the heat generating component, wherein the controller is configured to:
receive an indication of removal of the MEMS module;
monitor a temperature at the heat generating component; and
modify an operating mode of the heat generating component upon the temperature exceeding a predetermined limit.

8. The apparatus of claim 7, wherein the indication of removal of the MEMS module comprises input from an online installation and removal switch.

9. The apparatus of claim 7, wherein the controller is configured to provide an indication that is it safe to remove the MEMS module based on the temperature.

10. The apparatus of claim 7, wherein the power unit is configured to receive power and SPE (Single Pair Ethernet).

11. The apparatus of claim 7, wherein the power unit comprises a pulse width modulation power controller operable to individually control one or more of the air movement cells.

12. The apparatus of claim 7, wherein the heat generating component comprises an optical module and wherein the MEMS module and the optical module are removably inserted into an optical cage module.

13. The apparatus of claim 7, wherein the heat generating component comprises an offload engine at an access point.

14. The apparatus of claim 7, further comprising a plurality of heat generating components each of which is positioned adjacent the MEMS module, and wherein the controller is configured to modify an operating mode of respective ones of the plurality of heat generating components.

15. An apparatus comprising:
a power unit including a microelectromechanical system (MEMS) module having plurality of air movement cells configured to cool a heat generating component positioned adjacent to the MEMS module, wherein the power unit further includes a pulse width modulation power controller operable to individually control one or more of the air movement cells; and
a controller coupled to the MEMS module and to the heat generating component, wherein the controller is configured to:
monitor a temperature at the heat generating component; and
modify an operating mode of the heat generating component upon the temperature exceeding a predetermined limit.

16. The apparatus of claim 15, wherein the controller is configured to provide an indication that is it safe to remove the MEMS module based on the temperature.

17. The apparatus of claim 16, wherein the indication of removal of the MEMS module comprises input from an online installation and removal switch.

18. The apparatus of claim 15, wherein the power unit is configured to receive power and SPE (Single Pair Ethernet).

19. The apparatus of claim 15, wherein the heat generating component comprises an optical module and wherein the MEMS module and the optical module are removably inserted into an optical cage module.

20. The apparatus of claim 15, further comprising a plurality of heat generating components each of which is positioned adjacent the MEMS module, and wherein the controller is configured to modify an operating mode of respective ones of the plurality of heat generating components.

* * * * *